(12) United States Patent
Hyoung et al.

(10) Patent No.: US 6,985,049 B2
(45) Date of Patent: Jan. 10, 2006

(54) SWITCHED COUPLER TYPE DIGITAL PHASE SHIFTER USING QUADRATURE GENERATOR

(75) Inventors: Chang Hee Hyoung, Daejon (KR); Sung Weon Kang, Daejon (KR); Yun Tae Kim, Daejon (KR)

(73) Assignee: Electronics and Telecommunications Research Institute (KR)

( * ) Notice: Subject to any disclaimer, the term of this patent is extended or adjusted under 35 U.S.C. 154(b) by 52 days.

(21) Appl. No.: 10/716,571

(22) Filed: Nov. 18, 2003

(65) Prior Publication Data

US 2004/0100315 A1 May 27, 2004

(30) Foreign Application Priority Data

Nov. 18, 2002 (KR) .................. 10-2002-0071513

(51) Int. Cl.
*H01P 1/18* (2006.01)

(52) U.S. Cl. ...................... 333/156; 333/164
(58) Field of Classification Search ................ 333/101, 333/103, 138–140, 156, 161, 164
See application file for complete search history.

(56) References Cited

U.S. PATENT DOCUMENTS

| 4,977,382 A | * | 12/1990 | Podell et al. ............... 333/164 |
| 4,994,773 A | * | 2/1991 | Chen et al. .................. 333/164 |
| 5,334,959 A | | 8/1994 | Krafcsik et al. |
| 5,379,007 A | | 1/1995 | Nakahara |

FOREIGN PATENT DOCUMENTS

| JP | 03-291008 | 12/1991 |
| KR | 1999-006684 | 8/1999 |
| KR | 2002-28258 | 4/2002 |

OTHER PUBLICATIONS

"Microwave ICI control components for phased–array antennas", Electronics & Communications Engineering Journal, Jun. 1992, pp. 123–130.
"An Ultra–Broad–Band Reflection–Type Phase–Shifter MMIC With Series and Parallel LC Circuits", K. Miyaguchi, IEEE Transactions on Microwave Theory and Techniques, vol. 49, No. 12, Dec. 2001, pp. 2446–2452.
"A Single Chip X–Based Phase Shifter With 6 Bit Uncorrected Phase Resolution and More Than 8 Bit Corrected Phase Resolution", T. Tieman, et al, 1992 IEEE MTT–S Digest, pp. 171–174.
"4:1 Bandwidth Digital Five Bit MMIC Phase Shifters", D.C. Boire, IEEE 1989 Microwave and Millimeter–wave Monolithic Circuits Symposium, pges 69–73.

* cited by examiner

*Primary Examiner*—Seungsook Ham
(74) *Attorney, Agent, or Firm*—Blakely Sokoloff Taylor & Zafman

(57) ABSTRACT

A switched coupler type digital phase shifter using a quadrature generator is disclosed. A switched coupler type digital phase shifter includes: a coupling unit for receiving one input signal and generating a first signal and a second signal having 180 degree phase difference based on the received input signal; a quadrature signal generation unit for generating a third signal to a sixth signal having 90 degree phase difference to each other based on the first signal and the second signal outputted from the coupling unit; and a switching unit for selectively outputting one of the third signal to the sixth signal outputted from the quadrate signal generation unit in response to a control signal. The present invention can increased integration of the multi-bit digital phase shifter by implementing multi bit phase variant with only one phase shifter. Also, the insertion loss can be minimized.

7 Claims, 2 Drawing Sheets

SWITCHED COUPLER TYPE DIGITAL PHASE SHIFTER USING QUADRATURE GENERATOR

FIELD OF THE INVENTION

The present invention relates to a phase shifter; and, more particularly, to a switched coupler type digital phase shifter using a quadrature generator.

DESCRIPTION OF RELATED ARTS

Generally, a phase shifter is a two ports circuit providing an output having specific phase difference according to an inputted microwave frequency and it is widely used for a phase array antenna, radar and a linearized amplifier.

The phase shifter using semiconductor process is classified into an analogue phase shifter gaining continuous phase difference by using a varactor or a ferrite and a digital phase sifter gaining a binary phase difference by using a field-effective transistor (FET) or a pin diode. In a meantime, the digital phase shifter is further classified into a switched line type, a reflection delay line type, a loaded line type, a switched network type and a switched coupler type.

Figure 1:
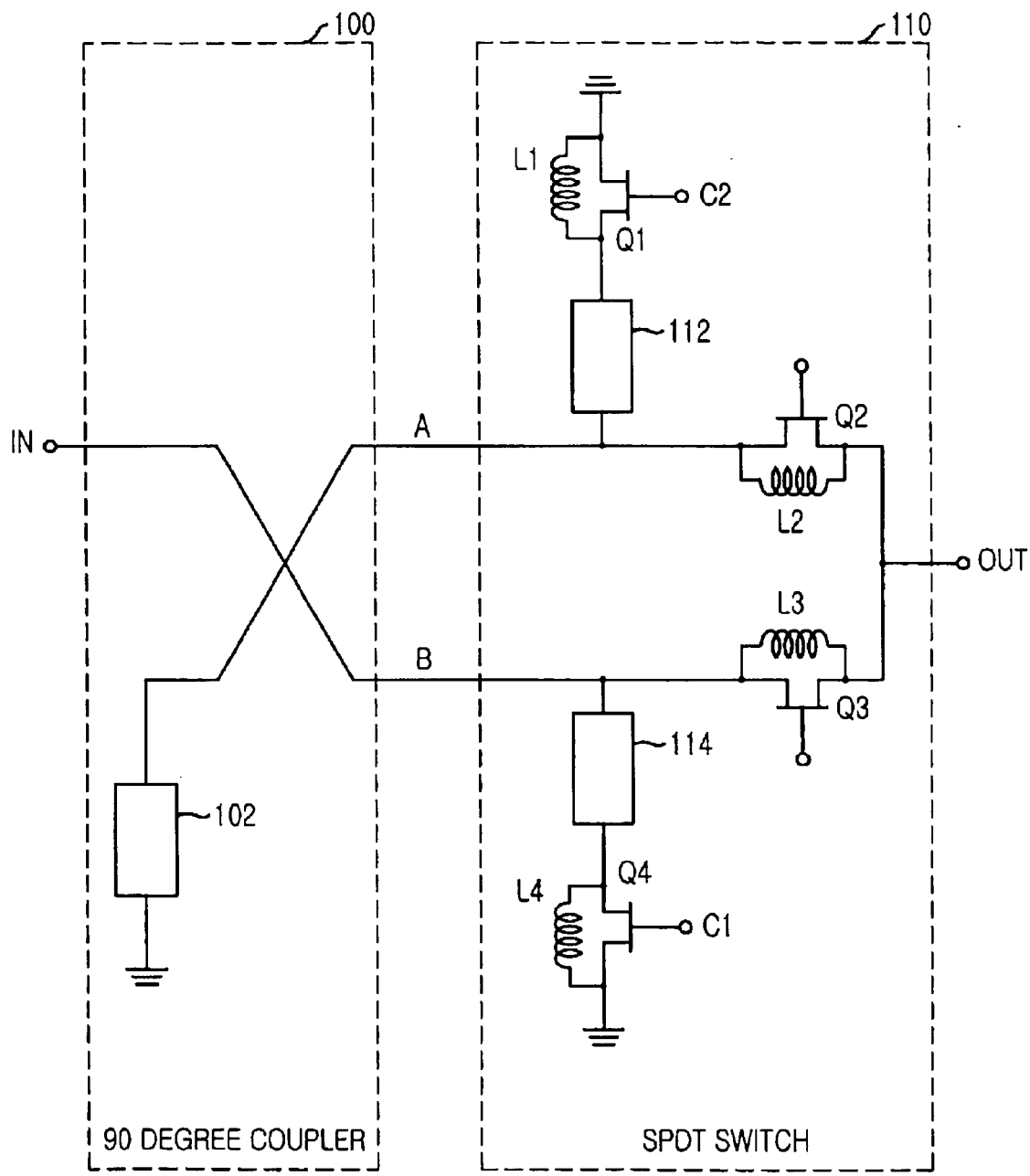

FIG. 1 is a circuit diagram illustrating a conventional switched coupler type digital phase shifter.

Referring to FIG. 1, the conventional switched coupler type digital phase shifter includes 90 degree coupler 100 and single pole double through switch 110.

The 90 degree coupler 100 has a transmission line 102 which 50 Ω of characteristic impedance for acts as an impedance-matching transformer to minimize the amplitude modulation between the switch and the coupler, a first output terminal A for providing 90 degree phase difference according to each of input IN and a second output terminal B for providing an output having 0 degree phase difference.

The SPDT switch 110 having a first inductor L1 and a first FET Q1 connected each others in a parallel between the transmission line 112 coupled to the first output terminal A and a ground terminal, a second inductor L2 and a second FET Q2 connected each others in a parallel between the first output terminal A and a final output terminal OUT, a third inductor L3 and a third FET Q3 connected each others in a parallel between the second output terminal B and the final output terminal OUT and a fourth inductor L4 and a fourth FET Q4 connected each others in a parallel between the transmission line 114 and the ground terminal.

In here, the second FET Q2 and the fourth FET Q4 are controlled by a first control signal C1 and a first FET Q1 and the third FET Q3 are controlled by a second control signal C2.

Hereinafter, operations of the conventional switched coupler type digital phase shifter are explained in detail.

The first and second control signal C1 and C2 of the SPDT switch 110 have a different logical characteristics. That is, if the first control signal C1 is a state of logically high, at the same time the second control signal C2 is a state of logically low and vice versa. Two signals C1 and C2 are complementary.

At first, if the first control signal C1 is in the on-state, the second FET Q2 and fourth FET Q4 are operated as a simplified short circuit and the first transistor Q1 and third transistor Q3 are modeled as a capacitance. As a result, each of the first and third transistor Q1 and 03 becomes resonate circuit with the first inductor L1 and third inductor L3 as a open circuit. Therefore, an applied signal through the first output terminal A is outputted to the final output terminal OUT through the second FET Q2 constructing the short circuit. In a meantime, an applied signal to the second output terminal B is passed to the ground terminal passing through the transmission line 114 and the fourth FET Q4. The transmission line 114 acts as an impedance-matching transformer to minimize the amplitude modulation between the switch and the coupler.

In contrary, if the second control signal C2 is activated, the first and third FETs Q1 and Q3 is operated as a simplified short circuit and the second FET Q2 and fourth FET Q4 are modeled as a capacitance. As a result, each of the second and fourth FET Q2 and Q4 becomes resonate circuit with the second and fourth inductors L2 and L4 as a open circuit. Therefore, an applied signal through the second output terminal B is outputted to the final output terminal OUT through the third FET Q3 constructing the short circuit. In a meantime, the applied signal through the first output terminal A is passed through the transmission line 112 and the first FET Q1 to the ground terminal. The transmission line 112 acts as an impedance-matching transformer to minimize the amplitude modulation between the switch and the coupler.

That is, it is possible to select two signals having 90 degree of phase difference by the first and second control signals C1 and C2.

However, the conventional switched coupler type digital phase shifter has a 3 bB insertion loss caused by inherent characteristic of 90 degree coupler and there is a limitation to have only one phase variant bit with one phase shifter module.

SUMMARY OF THE INVENTION

It is, therefore, an object of the present invention to provide a switched coupler type digital phase shifter for implementing multiple phase variants with one phase shifter.

Also, it is another object of the present invention to provide a switched coupler type digital phase shifter for reducing 3 dB insertion loss caused by 90 degree coupler.

In accordance with an aspect of the present invention, there is provided a switched coupler type digital phase shifter, including: a coupling unit for receiving one input signal and generating a first signal and a second signal having 180 degree phase difference based on the received input signal; a quadrature signal generation unit for generating a third signal to a sixth signal having 90 degree phase difference to each other based on the first signal and the second signal outputted from the coupling unit; and a switching unit for selectively outputting one of the third signal to the sixth signal outputted from the quadrate signal generation unit in response to a control signal.

In accordance with another aspect of the present invention, there is provided a multi-bit digital phase shifter including: a controller for generating a control signals; a digital phase shifter for receiving an input signal and the control signals from the controller and generating a first phase shifted signal having 45 degree phase difference comparing to the input signal base on the control signals; and a switched coupler-type digital phase shifter for receiving the first phase shifted signal from a digital phase shifter and the control signals from the controller and generating a second phase shifted signal having 90 degree phase difference comparing to the first phase shifted signal, wherein the switched coupler type digital phase shifter has: a coupling unit for receiving the first phase shifted signal and generating a first signal and a second signal having 180 degree phase difference based on the received input signal; a quadrature signal generation unit for generating a third signal to a sixth signal having 90 degree phase difference to each other based on the first signal and the second signal outputted from the coupling unit; and a switching unit for selectively outputting one of the third signal to the sixth signal outputted from the quadrate signal generation unit as the second phase shifted signal in response to a control signals.

In accordance with still another aspect of the present invention, there is provided a multi-bit digital phase shifter including: a controller for generating a control signals; a switched coupler type digital phase shifter for receiving an input signal and the control signals from the controller and generating a first phase shifted signal based on the control signals, wherein the switched coupler type digital phase shifter has: a coupling unit for receiving the input signal and generating a first signal and a second signal having 180 degree phase difference based on the received input signal; a quadrature signal generation unit for generating a third signal to a sixth signal having 90 degree phase difference to each other based on the first signal and the second signal outputted from the coupling unit; and a switching unit for selectively outputting one of the third signal to the sixth signal outputted from the quadrate signal generation unit as the first phase shifted signal in response to a control signals; and a digital phase shifter for receiving the first phase shifted signal from the switched coupler type digital phase shifter and the control signals from the controller and generating a second phase shifted signal having 45 degree phase difference comparing to the first phase shifted signal base on the control signals.

BRIEF DESCRIPTION OF THE DRAWING(S)

Figure 2:
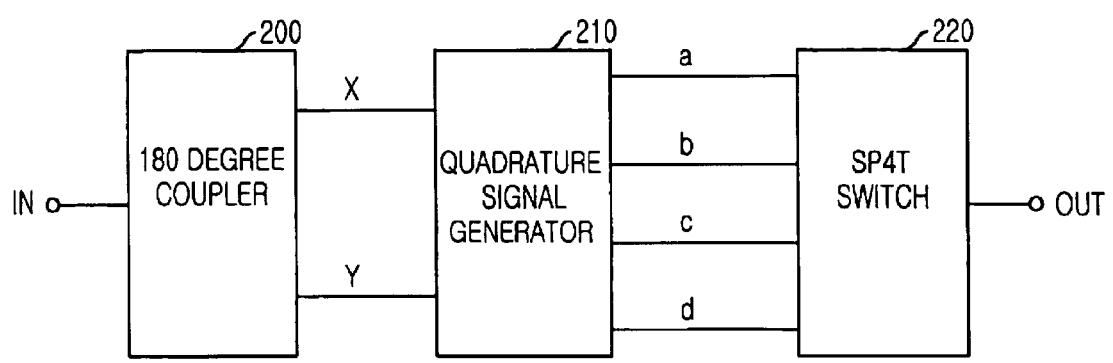

The above and other objects and features of the present invention will become apparent from the following description of the preferred embodiments given in conjunction with the accompanying drawings, in which:

FIG. 1 is a circuit diagram illustrating a conventional switched coupler type digital phase shifter; and FIG. 2 is a diagram showing a switched coupler type digital phase shifter in accordance with a preferred embodiment of the present invention.

DETAILED DESCRIPTION OF THE INVENTION

Other objects and aspects of the invention will become apparent from the following description of the embodiments with reference to the accompanying drawings, which is set forth hereinafter.

FIG. 2 is a diagram showing a switched coupler type digital phase shifter in accordance with a preferred embodiment of the present invention.

Referring to FIG. 2, the switched coupler type digital phase shifter includes a 180 degree coupler 200, a quadrature generator 210 and a single pole 4-through switch 220. That is, the preferred embodiment of the present invention generates 4 signals having 90 degree phase difference each other by connecting the 180 degree coupler 200 to the quadrature generator 210 and one of 4 signals is selected by the SP4T switch 220 having 4 input ports a, b, c and d and one output port OUT according to a control signal.

By implementing the quadrate generator 210 as a polyphase filter, a phase error can be reduced and a bandwidth can be increased by controlling the polyphase filter. In a meantime; the 180 degree coupler 200 can be implemented as a passive element such as hybrid coupler, rat race, passive balanced-to-unbalanced (balun) or an active element such as an active balun. The SP4T switch 220 can be implemented by using a circuit with the FET and the diode. Also, a micro electro mechanic device can be used as the SP4T switch 220. In a meantime, the 180 degree coupler 200 which is specially implemented by using an active balun, can reduce 3 dB insertion loss, which is a problem of the 90 degree coupler included in the conventional switched coupler type digital phase shifter and also compensate the insertion loss of the quadrate signal generator 210.

Hereinafter, operations of the switched coupler type digital phase shifter are explained in detail.

At first, an input signal IN is separated into two output signals X and Y at the 180 degree coupler.

Secondly, the quadrature generator 210 receives the output signals X and Y having 180 degree phase difference and outputs 4 output signals a, b, c and d having 90 degree phase difference each other.

And, the SP4T switch 220 selectively outputs one output signal among the 4 output signals a, b, c and d having a 90 degree phase difference in response to the control signal Ctrl (not-in depicted in FIG. 2).

As mentioned above, 2 bits digital phase shifter having minimum 90 degree phase difference, is implemented in one phase shifter module using the switched coupler type digital phase shifter of the present invention. Accordingly, the phase error can be reduced and integration of a multi bit digital phase shifter can be increased.

In a meantime, a multi bit digital phase shifter having simpler structure than conventional multi bit digital phase shifter can be implemented by using the present invention. A 3 bits phase shifter can produce 8 signals and a minimum phase difference is 45 degrees. According to digital control signals, the 3 bits phase shifter generates 8 states having 45 degree of phase difference to each others. For example, a multi bit digital phase shifter in accordance with a preferred embodiment of the present invention is explained hereinafter. The multi bit digital phase shifter includes a controller to generate control signals for the switched coupler type digital phase shifter of FIG. 2 and a 45 degree digital phase shifter in order to generate a 45 degree phase shifted signal. A detailed explanation of the switched coupler type digital phase shifter is omitted since it has been already explained by referring to FIG. 2. The 45 degree digital phase shifter is connected to back of the switched coupler type digital phase shifter in series. The 45 degree digital phase shifter receives the output signal from the switched coupler type digital phase shifter and generated the 45 degree phase shifted signal comparing to the output signal based on the control signals from the controller.

The 45 degree digital phase shifter may be-connected to front of the switched coupler type digital phase shifter in series and a multi bit digital phase shifter with the 45 degree digital phase shifter installed in front of the switched coupler type digital phase shifter has same result of the multi bit digital phase shifter with the 45 degree digital phase shifter installed in back of the switched coupler type digital phase shifter.

Generally, 180, 90, 45 degree phase shifters are combined for implementing the 3 bit phase shifter. However, by using the digital 90 degree phase shifter of the present invention, only 45 degree phase shifter is additionally required for implementing the 3 bit phase shifter. That is, by using the digital 90 degree phase shifter of the present invention, 180 degree phase shifter is no longer necessary to implement the 3 bit phase shifter. In a meantime, a multi-bit more than 4-bits phase shifter also can be simply implemented by equipping phase shifters having smaller phase difference in front and back of the present invention.

As mentioned above, the present invention can increased integration of the multi-bit digital phase shifter by implementing multi bit phase variant with only one phase shifter. Also, the insertion loss can be minimized.

While the present invention has been described with respect to certain preferred embodiments, it will be apparent to those skilled in the art that various changes and modifications may be made without departing from the scope of the invention as defined in the following claims.

What is claimed is:

1. A switched coupler type digital phase shifter, comprising:
    a coupling means for receiving one input signal and generating a first signal and a second signal having 180 degree phase difference based on the received input signal;
    a quadrature signal generation means for generating a third signal to a sixth signal having 90 degree phase difference to each other based on the first signal and the second signal outputted from the coupling means; and
    a switching means for selectively outputting one of the third signal to the sixth signal outputted from the quadrature signal generation means in response to a control signal.

2. The switched coupler type digital phase shifter as recited in claim 1, wherein the coupling means includes an active balanced-to-unbalanced (balun).

3. The switched coupler type digital phase shifter as recited in claim 1, wherein the coupling means includes a passive balanced-to-unbalanced (balun).

4. The switched coupler type digital phase shifter as recited in claim 1, wherein the switching means includes a SP4T switch implemented by using a circuit of transistor and diode or a micro electron mechanical (MEM) device.

5. The switched coupler type digital phase shifter as recited in claim 1, wherein the quadrature signal generation means includes a poly-phase filter.

6. A multi-bit digital phase shifter, comprising:
    a controller for generating control signals;
    a digital phase shifter for receiving an input signal and the control signals from the controller and generating a first phase shifted signal having 45 degree phase difference comparing to the input signal base on the control signals; and
    a switched coupler type digital phase shifter for receiving the first phase shifted signals from a digital phase shifter and the control signal from the controller and generating a second phase shifted signal having 90 degree phase difference comparing to the first phase shifted signal,
    wherein the switched coupler type digital phase shifter includes:
        a coupling means for receiving the first phase shifted signal and generating a first signal and a second signal having 180 degree phase difference based on the received input signal;
        a quadrature signal generation means for generating a third signal to a sixth signal having 90 degree phase difference to each other based on the first signal and the second signal outputted from the coupling means; and
        a switching means for selectively outputting one of the third signal to the sixth signal outputted from the quadrature signal generation means as the second phase shifted signal in response to a control signals.

7. A multi-bit digital phase shifter, comprising:
    a controller for generating a control signals;
    a switched coupler type digital phase shifter for receiving an input signal and the control signal from the controller and generating a first phase shifted signal based on the control signals,
    wherein the switched coupler type digital phase shifter includes:
        a coupling means for receiving the input signal and generating a first signal and a second signal having 180 degree phase difference based on the received input signal;
        a quadrature signal generation means for generating a third signal to a sixth signal having 90 degree phase difference to each other based on the first signal and the second signal outputted from the coupling means; and
        a switching means for selectively outputting one of the third signal to the sixth signal outputted from the quadrature signal generation means as the first phase shifted signal in response to a control signals; and
    a digital phase shifter for receiving the first phase shifted signal from the switched coupler type digital phase shifter and the control signals from the controller and generating a second phase shifted signal having 45 degree phase difference comparing to the first phase shifted signal base on the control signals.

* * * * *